United States Patent
Schultz

(10) Patent No.: US 7,111,217 B1
(45) Date of Patent: Sep. 19, 2006

(54) METHOD AND SYSTEM FOR FLEXIBLY NESTING JTAG TAP CONTROLLERS FOR FPGA-BASED SYSTEM-ON-CHIP (SOC)

(75) Inventor: David P. Schultz, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 415 days.

(21) Appl. No.: 10/086,129

(22) Filed: Feb. 28, 2002

(51) Int. Cl.
G01R 31/28 (2006.01)

(52) U.S. Cl. .................................................. 714/727
(58) Field of Classification Search ................ 714/733, 714/724, 725, 726, 727, 729, 30; 326/39, 326/40
See application file for complete search history.

(56) References Cited

U.S. PATENT DOCUMENTS

| | | | |
|---|---|---|---|
| 4,758,985 A | 7/1988 | Carter | |
| 4,855,669 A | 8/1989 | Mahoney | |
| 5,072,418 A | 12/1991 | Boutaud et al. | |
| 5,142,625 A | 8/1992 | Nakai | |
| RE34,363 E | 8/1993 | Freeman | |
| 5,274,570 A | 12/1993 | Izumi et al. | |
| 5,311,114 A | 5/1994 | Sambamurthy et al. | |
| 5,339,262 A | 8/1994 | Rostoker et al. | |
| 5,347,181 A | 9/1994 | Ashby et al. | |
| 5,361,373 A | 11/1994 | Gilson | |
| 5,457,410 A | 10/1995 | Ting | |
| 5,473,267 A | 12/1995 | Stansfield | |
| 5,500,943 A | 3/1996 | Ho et al. | |
| 5,504,738 A | 4/1996 | Sambamurthy et al. | |
| 5,537,601 A | 7/1996 | Kimura et al. | |
| 5,543,640 A | 8/1996 | Sutherland et al. | |
| 5,550,782 A | 8/1996 | Cliff et al. | |
| 5,552,722 A | 9/1996 | Kean | |
| 5,574,930 A | 11/1996 | Halverson, Jr. et al. | |
| 5,574,942 A | 11/1996 | Colwell et al. | |
| 5,581,745 A | 12/1996 | Muraoka | |
| 5,600,845 A | 2/1997 | Gilson | |
| 5,652,904 A | 7/1997 | Trimberger | |
| 5,671,355 A | 9/1997 | Collins | |
| 5,705,938 A | 1/1998 | Kean | |
| 5,732,250 A | 3/1998 | Bates et al. | |

(Continued)

FOREIGN PATENT DOCUMENTS

EP 0315275 A2 10/1989

(Continued)

OTHER PUBLICATIONS

Sayfe Kiaei et al., "VLSI Design of Dynamically Reconfigurable Array Processor-DRAP," IEEE, Feb. 1989, pp. 2484-2488, V3.6, IEEE, 3 Park Avenue, 17th Floor, New York, NY 10016-5997.

(Continued)

Primary Examiner—Guy Lamarre
Assistant Examiner—James C. Kerveros
(74) Attorney, Agent, or Firm—Pablo Meles; John J. King

(57) ABSTRACT

A flexible architecture for nesting joint test action group (JTAG) test access port (TAP) controllers for FPGA-based embedded system-on-chip (SoC) is provided. Advantageously, a programmable approach permits bits in a selectable bit register (302) to be selected based on the number of JTAG TAPs that will be utilized. The selected bits can be used to vary the apparent length of an instruction register (302). Importantly, the flexible architecture permits access to any combination of a plurality of JTAG TAP controllers in the FPGA-based embedded SoC without the need to rewire any I/O pins of the FPGA and/or embedded IP cores.

27 Claims, 3 Drawing Sheets

U.S. PATENT DOCUMENTS

| | | | |
|---|---|---|---|
| 5,737,631 | A | 4/1998 | Trimberger |
| 5,740,404 | A | 4/1998 | Baji |
| 5,742,179 | A | 4/1998 | Sasaki |
| 5,742,180 | A | 4/1998 | DeHon et al. |
| 5,748,979 | A | 5/1998 | Trimberger |
| 5,752,035 | A | 5/1998 | Trimberger |
| 5,760,607 | A | 6/1998 | Leeds et al. |
| 5,809,517 | A | 9/1998 | Shimura |
| 5,835,405 | A | 11/1998 | Tsui et al. |
| 5,874,834 | A | 2/1999 | New |
| 5,889,788 | A | 3/1999 | Pressly et al. |
| 5,892,961 | A | 4/1999 | Trimberger |
| 5,914,616 | A | 6/1999 | Young et al. |
| 5,914,902 | A | 6/1999 | Lawrence et al. |
| 5,933,023 | A | 8/1999 | Young |
| 5,970,254 | A | 10/1999 | Cooke et al. |
| 6,011,407 | A | 1/2000 | New |
| 6,020,755 | A | 2/2000 | Andrews et al. |
| 6,026,481 | A | 2/2000 | New et al. |
| 6,096,091 | A | 8/2000 | Hartmann |
| 6,154,051 | A | 11/2000 | Nguyen et al. |
| 6,163,166 | A | 12/2000 | Bielby et al. |
| 6,172,990 | B1 | 1/2001 | Deb et al. |
| 6,178,541 | B1 | 1/2001 | Joly et al. |
| 6,181,163 | B1 | 1/2001 | Agrawal et al. |
| 6,211,697 | B1 | 4/2001 | Lien et al. |
| 6,242,945 | B1 | 6/2001 | New |
| 6,272,451 | B1 | 8/2001 | Mason et al. |
| 6,279,045 | B1 | 8/2001 | Muthujumaraswathy et al. |
| 6,282,627 | B1 | 8/2001 | Wong et al. |
| 6,301,696 | B1 | 10/2001 | Lien et al. |
| 6,324,662 | B1 * | 11/2001 | Haroun et al. ............... 714/724 |
| 6,343,207 | B1 | 1/2002 | Hessel et al. |
| 6,353,331 | B1 | 3/2002 | Shimanek |
| 6,356,987 | B1 | 3/2002 | Aulas |
| 6,389,558 | B1 | 5/2002 | Herrmann et al. |
| 6,434,735 | B1 | 8/2002 | Watkins |
| 6,460,172 | B1 | 10/2002 | Insenser Farre et al. |
| 6,467,009 | B1 | 10/2002 | Winegarden et al. |
| 6,483,342 | B1 | 11/2002 | Britton et al. |
| 6,507,942 | B1 | 1/2003 | Calderone et al. |
| 6,510,548 | B1 | 1/2003 | Squires |
| 6,518,787 | B1 | 2/2003 | Allegrucci et al. |
| 6,519,753 | B1 | 2/2003 | Ang |
| 6,522,167 | B1 | 2/2003 | Ansari et al. |
| 6,532,572 | B1 | 3/2003 | Tetelbaum |
| 6,539,508 | B1 | 3/2003 | Patrie et al. |
| 6,541,991 | B1 | 4/2003 | Horncheck et al. |
| 6,578,174 | B1 | 6/2003 | Zizzo |
| 6,587,995 | B1 | 7/2003 | Duboc et al. |
| 6,588,006 | B1 | 7/2003 | Watkins |
| 6,601,227 | B1 | 7/2003 | Trimberger |
| 6,604,228 | B1 | 8/2003 | Patel et al. |
| 6,611,951 | B1 | 8/2003 | Tetelbaum et al. |
| 6,829,730 | B1 * | 12/2004 | Nadeau-Dostie et al. ..... 714/30 |
| 2001/0049813 | A1 | 12/2001 | Chan et al. |
| 2003/0062922 | A1 | 4/2003 | Douglass et al. |

FOREIGN PATENT DOCUMENTS

| | | |
|---|---|---|
| EP | 0 905 906 A2 | 3/1999 |
| EP | 1 235 351 A1 | 8/2002 |
| WO | WO 93 25968 A1 | 12/1993 |

OTHER PUBLICATIONS

Vason P. Srini, "Field Programmable Gate Array (FPGA) Implementation of Digital Systems: An Alternative to ASIC," IEEE, May 1991, pp. 309-314, IEEE, 3 Park Avenue, 17th Floor, New York, NY 10016-5997.

G. Maki et al., "A Reconfigurable Data Path Processor," IEEE, Aug. 1991, pp. 18-4.1 to 18-4.4, IEEE, 3 Park Avenue, 17th Floor, New York, NY 10016-5997.

Jacob Davidson, "FPGA Implementation of Reconfigurable Microprocessor," IEEE, Mar. 1993, pp. 3.2.1-3.2.4, IEEE, 3 Park Avenue, 17th Floor, New York, NY 10016-5997.

Christian Iseli et al., "Beyond Superscaler Using FPGA's," IEEE, Apr. 1993, pp. 486-490, IEEE, 3 Park Avenue, 17th Floor, New York, NY 10016-5997.

P.C. French et al., "A Self-Reconfiguring Processor,"; IEEE, Jul. 1993, pp. 50-59, IEEE, 3 Park Avenue, 17th Floor, New York, NY 10016-5997.

Christian Iseli et al., "Spyder: A Reconfigurable VLIW Processor Using FPGA's," IEEE, Jul. 1993, pp. 17-24, IEEE, 3 Park Avenue, 17th Floor, New York, NY 10016-5997.

Michael J. Wirthlin et al., "The Nano Processor: A Low Resource Reconfigurable Processor," IEEE, Feb. 1994, pp. 23-30, IEEE, 3 Park Avenue, 17th Floor, new York, NY 10016-5997.

William S. Carter, "The Future of Programmable Logic and its Impact on Digital System Design," Apr. 1994, IEEE, pp. 10-16, IEEE, 3 Park Avenue, 17th Floor, New York, NY 10016-5997.

Andre' Dehon, "DPGA-Coupled Microprocessors: Commodity ICs for the Early 21st Century,"IEEE, Feb. 1994, pp. 31-39, IEEE, 3 Park Avenue, 17th Floor, New York, NY 10016-5997.

Osama T. Albaharna, "Area & Time Limitations of FPGA-Based Virtual Hardware," IEEE, Apr. 1994, pp. 184-189, IEEE, 3 Park Avenue, 17th Floor, New York, NY 10016-5997.

U.S. Appl. No. 10/043,769, filed Jan. 9, 2002, Schulz.

*Xilinx, Inc.*, "The Programmable Logic Data Book," 1994, Revised 1995, Xilinx, Inc., 2100 Logic Drive, San Jose, CA. 95124.

*Xilinx, Inc.*, "The Programmable Logic Data Book," 1994, Revised 1995, pp. 2-109 to 2-117, Xilinx, Inc., 2100 Logic Drive, San Jose, CA. 95124.

*Xilinx, Inc.*, "The Programmable Logic Data Book," 1994, Revised 1995, pp. 2-9 to 2-18; 2-187 to 2-199, Xilinx, Inc., 2100 Logic Drive, San Jose, CA. 95124.

*Xilinx, Inc.*, "The Programmable Logic Data Book," 1994, Revised 1995, pp. 2-107 to 2-108, Xilinx, Inc., 2100 Logic Drive, San Jose, CA. 95124.

Christian Iseli et al., "AC++ Compiler for FPGA Custom Execution Units Synthesis," 1995, pp. 173-179, IEEE, 3 Park Avenue, 17th Floor, New York, NY 10016-5997.

*International Business Machines*, "PowerPC 405 Embedded Processor Core User Manual," 1996, 5th Ed., pp. 1-1 to X-16, International Business Machines, 1580 Rout 52, Bldg. 504, Hopewell Junction, NY 12533-6531.

Yamin Li et al., "Aizup-a Pipelined Processor Design & Implementation on Xilinx FPGA Chip," IEEE, Sep. 1996, pp. 98-106, 98-106, IEEE, 3 Park Avenue, 17th Floor, New York, NY 10016-5997.

Ralph D. Wittig et al., OneChip: an FPGA Processor With Reconfigurable Logic, Apr. 17, 1996, pp. 126-135, IEEE, 3 Park Avenue, 17th Floor, New York, NY 10016-5997.

*Xilinx, Inc.*, "The Programmable Logic Data Book," Jan. 27, 1999, Ch. 3, pp. 3-1 to 3-50, Xilinx, Inc., 2100 Logic Drive, San Jose, CA 95124.

William B. Andrew et al., "A Field Programmable System Chip Which Combines FPGA & ASIC Circuitry," IEEE, May 16, 1999, pp. 183-186, IEEE, 3 Park Avenue, 17th Floor, New York, NY 10016-5997.

*Xilinx, Inc.*, "The Programmable Logic Data Book," 2000, Ch. 3 pp. 3-1 to 3-117, Xilinx, Inc., 2100 Logic Drive, San Jose, CA 95124.

U.S. Appl. No. 10/001,871, filed Nov. 19, 2001, Douglass et al.

U.S. Appl. No. 09/991,412, filed Nov. 16, 2001, Herron et al.

U.S. Appl. No. 09/991,410, filed Nov. 16, 2001, Herron et al.

U.S. Appl. No. 09/968,446, filed Sep. 28, 2001, Douglass et al.

*Xilinx, Inc.*, "The Programmable Logic Data Book," 2000, Ch. 3, pp. 3-7 to 3-17, 3-76 to 3-87, Xilinx, Inc., 2100 Logic Drive, San Jose, CA. 95124.

*International Business Machines*, "Processor Local Bus"Architecture Specifications, 32-Bit Implementation, Apr. 2000, First Edition, V2.9, pp. 1-76, IBM Corporation, Department H83A, P.O. Box 12195, research Triangle Park, NC 27709.

*Xilinx, Inc.*, Virtex II Platform FPGA Handbook, Dec. 6, 2000, v1.1, pp. 33-75, Xilinx, Inc., 2100 Logic Drive, San Jose, CA. 95124.

U.S. Appl. No. 09/858,732, filed May 15, 2001, Schulz.

U.S. Appl. No. 09/861,112, filed May 18, 2001, Dao et al.

U.S. Appl. No. 09/917,304, filed Jul. 27, 2001, Douglass et al.

Cary D. Snyder and Max Baron; "Xilinx's A-to-Z System Platform"; Cahners Microprocessor; The Insider's Guide to Microprocessor Hardware; Microdesign Resources; Feb. 6, 2001; pp. 1-5.

\* cited by examiner

METHOD AND SYSTEM FOR FLEXIBLY NESTING JTAG TAP CONTROLLERS FOR FPGA-BASED SYSTEM-ON-CHIP (SOC)

FIELD OF THE INVENTION

This invention relates generally to programmable logic devices, and more particularly to a method and system for flexibly nesting joint test action group (JTAG) test access port (TAP) controllers for FPGA-based system-on-chip (SoC).

BACKGROUND OF THE INVENTION

As chip capacity continues to significantly increase, the use of field programmable gate arrays (FPGAs) is quickly replacing the use of application specific integrated circuits (ASICs). An ASIC is a specialized chip that is designed for a particular application. Notably, an FPGA is a programmable logic device (PLD) that has an extremely high density of electronic gates as compared to an ASIC. This high gate density has contributed immensely to the popularity of FPGAs. Importantly, FPGAs can be designed using a variety of architectures which can include user configurable input/output blocks (IOBs) and programmable/configurable logic blocks (PLBs/CLBs) having configurable interconnects and switching capability.

The advancement of computer chip technology has also resulted in the development of embedded processors and controllers. An embedded processor or controller can be a microprocessor or microcontroller circuitry that has been integrated into an electronic device as opposed to being built as a standalone module or "plugin card." Advancement of FPGA technology has led to the development of FPGA-based system-on-chip (SoC), including FPGA-based embedded processor SoCs. A SoC is a fully functional product having its electronic circuitry contained on a single chip. While a microprocessor chip requires ancillary hardware electronic components to process instructions, a SoC can include all required ancillary electronics. For example, a SoC for a cellular telephone can include a microprocessor, encoder, decoder, digital signal processor (DSP), RAM and ROM. FPGA-based SoCs with embedded operating systems (OSs) have further enhanced their popularity and flexibility.

FPGA-based SoCS have resulted in the proliferation of numerous consumer devices such as wireless telephones, personal digital assistants (PDAs), and digital cameras. In order for device manufacturers to develop FPGA-based SoCs, it is necessary for them to acquire intellectual property rights for system components and/or related technologies that are utilized to create the FPGA-based SoCs. These system components and/or technologies are called cores or IP cores. An electronic file containing component information can typically be used to represent the core. A device manufacturer will generally acquire rights for one or more IP cores that are integrated to fabricate the SoC.

Notwithstanding the advantages provided by using FPGA-based SoCs, the development of these SoCs can be very challenging. Although a vast proportion of cores lie in the public domain, a significantly greater proportion of cores are proprietary. In order to use proprietary cores, a vast quantity of time, effort and money can be spent negotiating licensing agreements. Even after the cores are licensed, great care must be taken to properly integrate the cores prior to fabrication of the FPGA-based SoCs. Integration of the cores can include simulating, modeling and debugging the integrated cores in an operating environment. These tasks can be extremely daunting and time consuming and expensive. For example, during simulation and modeling, it can take hours if not days to simulate a few milliseconds of real time operation.

Importantly, verifying logic externally by probing the external pins has become increasingly difficult, if not impossible in certain scenarios. For example, flip-chip and ball grid array (BGA) packaging do not have exposed leads that can be physically probed using external tools such as an oscilloscope. Using traditional methods, capturing traces on devices running at system speeds in excess of 200 MHz can be challenging. Furthermore, most circuit boards are small and have multiple layers of epoxy, with lines buried deep within the epoxy layers. These lines are inaccessible using an external tool. Notably, attaching headers to sockets or SoCs to aid in debugging can have adverse effects on system timing, especially in the case of a high-speed bus. Notably, attaching headers can consume valuable printed circuit board (PCB) real estate.

Boundary-scan has been used to solve physical access problems resulting from high-density assemblies and packaging technologies used in PCB design. Boundary-scan solves physical access problems by embedding test circuitry, such as test access ports (TAPs), at chip level to debug, verify and test PCB assemblies. The institute of electronic engineers (IEEE) joint test action group (JTAG) has defined a standard, JTAG TAP also known as IEEE 1149.1, that utilizes boundary-scan for debugging and verifying PCB assemblies, such as SoCs.

FGPAs and IP cores utilized for SOC applications typically employ boundary-scan techniques by integrating one or more test access ports (TAPs), which can be used to verify and debug FPGA and embedded IP core logic. Notwithstanding the advantages of boundary-scan offered by JTAG TAP, there are inherent problems with debugging an verifying PCB assemblies that utilize multiple IP cores. For example, when multiple IP controller cores are utilized, the design arrangement of the IP controller cores can result in problems accessing each individual controller signals. Notably, such design arrangements are generally inflexible because they are hardwired and as a result, are permanent and non-programmable. Importantly, because of the non-programmability of such designs, designers have no choice but to test a hard-wired connection and subsequently re-wire the IP cores if changes are necessary. This often consumes a significant amount of development time, which translates directly into increased development cost.

The IP cores used in an SoC may have TAP controllers built into them. An SoC will generally have a TAP controller of its own. It would be desirable to have multiple TAPs on an SoC connected together so that they may be accessed simultaneously for test, debug, and other purposes. One method of connecting the TAPs together is to connect their Instruction Registers (IRs) in series in accordance with the present invention. This effectively creates a single, longer, IR. On a PLD, the connections between various IP blocks may be made through programmable interconnections. These interconnections are made by programming SRAM cells or other means. The interconnections do not exist prior to programming or configuration of the PLD. This leads to the problem that the IR will have one length prior to programming the PLD and a longer length afterward. Since it is required by the IEEE 1149.1 standard that the length of the Instruction Register (IR) of a TAP controller be fixed, this presents a problem.

One method of fixing this problem in accordance with the present invention is to have a selectable length shift register in the PLD TAP controller that can be placed in series with the PLD IR prior to programming. A multiplexer or other logic can be used to select between the output of the selectable shift register and the output of the IP core's IR. This selection can be made by a programmable SRAM cell as previously mentioned.

Given these inflexibilities and other inherent drawbacks, there is a need for a method and system for flexibly nesting JTAG TAP controllers for FPGA-based system-on-chip (SoC).

SUMMARY OF THE INVENTION

The invention provides a method and system for flexibly nesting JTAG TAP controllers for IP cores in an FPGA-based SoC. The method can include the step of programmably or manually selecting at least one available bit from a selectable bit register of a host JTAG TAP controller. An apparent length of an instruction register of a host JTAG TAP controller can be extended by using available bit(s) from the selectable bit register. At least one IP core JTAG TAP controller can be chosen from a plurality of IP core JTAG TAP controllers nested in the FPGA-based SoC. The chosen IP core JTAG TAP controller can subsequently be accessed through the host JTAG TAP controller. As instruction for the chosen IP core JTAG TAP controller can be loaded and shifted through the extended length instruction register, the chosen IP core JTAG TAP controller executes the loaded instruction.

The invention also provides a method for flexibly accessing nested JTAG TAP controllers for IP cores in an FPGA-based SoC. The method can include the step of choosing at least one IP core JTAG TAP controller from a plurality of JTAG TAP controllers nested in the FPGA-based SoC, and programmably connecting the selected IP core JTAG TAP controller to a host JTAG TAP controller. At least one available bit can be selected from a selectable bit register of the host JTAG TAP controller. An apparent length of an instruction register of the host JTAG TAP controller can be extended to include a combined length of the at selected bits(s) from the selectable bit register and the bits of the instruction register. An instruction can be shifted through the combined length instruction register, thereby causing a state transition in the JTAG TAP controller of the chosen IP core JTAG TAP controller.

In another aspect of the invention, system for flexibly accessing nested JTAG TAP controllers for IP cores in an FPGA-based SoC is provided. The system can include a selectable bit register in a host JTAG TAP controller having at least one available bit. A selector can facilitate selection of at least one available bit from the selectable bit register, thereby extending an apparent length of an instruction register of the host JTAG TAP controller. A multiplexer can be configured to choose at least one IP core JTAG TAP controller from a plurality of IP core JTAG TAP controllers nested in the FPGA-based SoC. The host JTAG TAP controller can subsequently access the chosen IP core JTAG TAP controller. A shift circuit can be used to shift an instruction for the chosen IP core JTAG TAP controller through the extended length instruction register, thereby causing the chosen IP core JTAG TAP controller to execute the instruction.

A further aspect of the invention also provides a system for flexibly accessing nested JTAG TAP controllers for IP cores in a FPGA-based SoC. The system can include a selector for choosing at least one IP core JTAG TAP controller from a plurality of JTAG TAP controllers nested in the FPGA-based SoC. A multiplexer can programmably connecting the selected IP core JTAG TAP controller(s) to a host JTAG TAP controller. An available bit in a selectable bit register can extend an apparent length of an instruction register of the host JTAG TAP controller to include a combined length of the bit or bits selected from the selectable bit register and the bits comprising the instruction register of the host JTAG TAP controller. A shift circuit can shift an instruction through the combined length instruction register, thereby causing a state transition in the chosen JTAG TAP controller.

In still yet another aspect of the invention, a method for ensuring an information register length for nested JTAG TAP controllers for IP cores remains the same before and after a configuration of an FPGA in an FPGA-based system-on-chip (SoC) comprises the steps of forming instruction registers for the IP cores that are in series with the instruction registers of the FPGA of the SoC, forming connections between FPGA JTAG logic of the FPGA and IP Core JTAG logic of the IP core using a programmable interconnect and emulating an instruction register of the IP core prior to configuration of the FPGA using a shift register of the same length as the instruction register of the IP core.

DETAILED DESCRIPTION OF THE DRAWINGS

Figure 1:
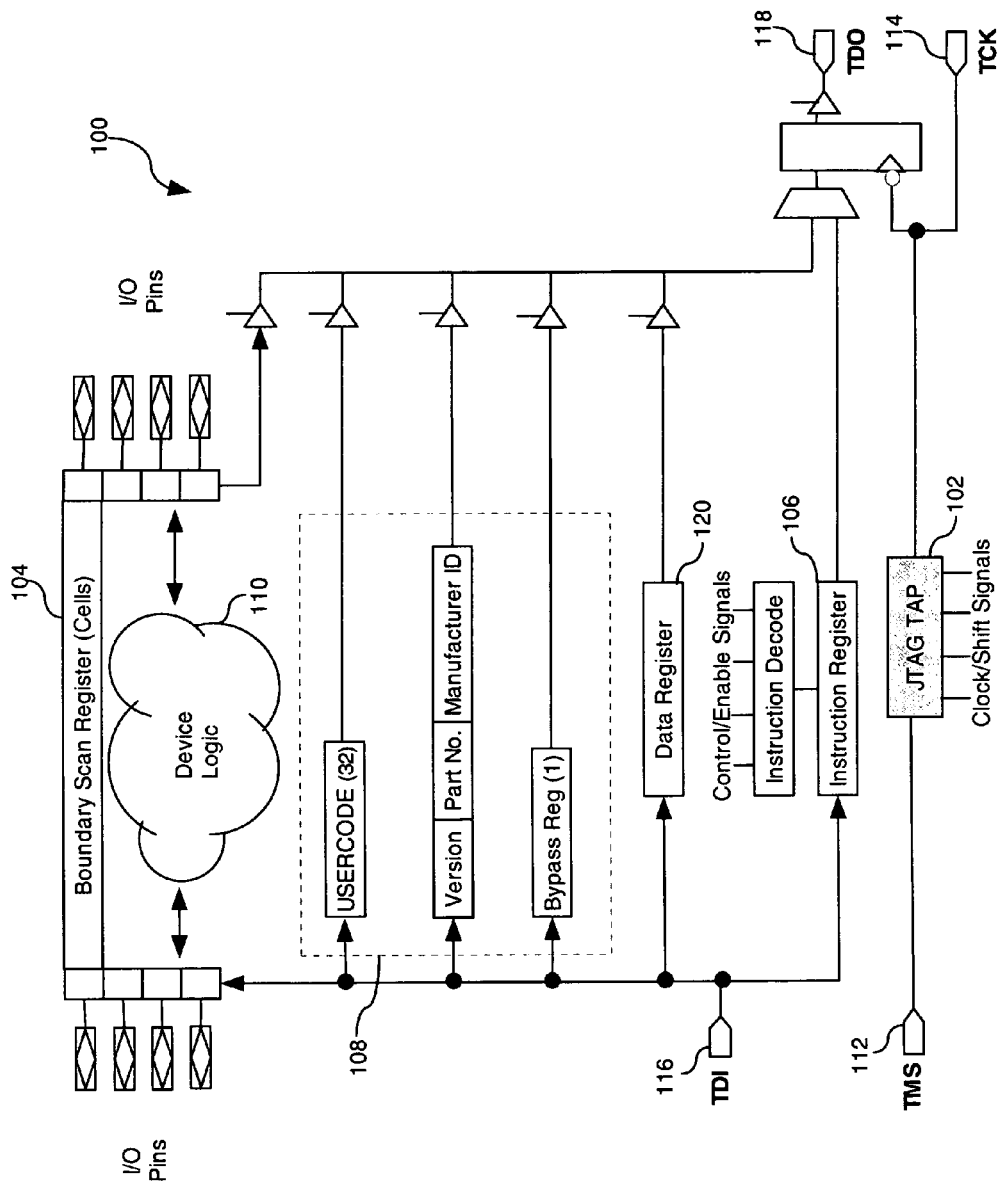
FIG. 1 is a block diagram of an exemplary JTAG boundary scan interface.

Referring to FIG. 1, there is shown a block diagram of the architecture of a JTAG boundary scan interface 100. The JTAG boundary scan interface 100 includes a JTAG TAP controller 102, boundary scan register (BSR) 104, instruction register (IR) 106, data register (DR) 120, various miscellaneous registers 108, and various control and clock signals including TMS 112, TCK 114, TDI 116 and TDO 118. The device logic 110 is not critical to understanding the operation the JTAG boundary scan interface 100.

JTAG TAP controller 102 is implemented as a finite state machine (FSM), which depending on the inputs applied, controls the operations used for verifying and debugging a JTAG TAP compliant IP core. As a FSM, JTAG TAP controller 102 utilizes various inputs to sequence through the various states of the FSM to achieve specific functions. Specifically, the JTAG TAP controller 102 utilizes four pins which include test mode select (TMS) 112, JTAG test clock (TCK) 114, test data input (TDI) 116 and test data out (TDO) 118, to drive the circuit block and control specific operations for the JTAG boundary scan interface 100.

TMS 112 functions as a mode input signal to the TAP controller 102. At the rising edge of TCK 114, TMS 112 determines the TAP controller's 102 state machines' sequence. TMS 112 has an internal pull-up resistor to provide a logic 1 to the system whenever TMS 112 is not driven.

TCK 114 provides the clock sequences to the TAP controller 102, as well as all the JTAG registers including DR 120 and IR 106 and the miscellaneous registers 108.

TDI 116 functions as the serial data input to all JTAG registers including IR 106, DR 120 and miscellaneous registers 108. The contents of the TAP controller's state and the instructions in the IR 106 determine which register is fed by TDI 116 for any operation. TDI 116 has an internal pull-up resistor to provide a logic 1 to the system whenever TDI 116 is not driven. TDI 116 is loaded into the JTAG registers on the rising edge of TCK 114.

TDO 118 is the serial data output for all JTAG registers including IR 106, DR 120 and miscellaneous registers 108. The state of the TAP controller 102 and the contents of the IR 106 determine which register feeds TDO 118 for a specific operation. Only one register, either IR 106 or DR 120 is connected between TDI 116 and TDO for any JTAG operation. TDO 118 changes state on the falling edge of TCK 114 and is only active during the shifting of data. TDO 118 remains in a tri-state condition at all other times.

IR 106 is a shift register-based circuit and is serially loaded with instructions that select an operation to be performed.

The DR 120, of which there can be more than one, are a bank of shift registers. The stimuli required by an operation are serially loaded into the DR(s) 120 selected by the current instruction. Following execution of the operation, results can be shifted out using TCK 114 for examination.

BSR 104 is a shift register in which a single cell is linked to every digital pin of an IP core to be tested. Each cell of the BSR 104 is called a boundary-scan cell (BSC) and connects the JTAP TAP to the internal logic of the IP core to be tested. Under normal operation of an IP core, the BSR 104 remains passive. However, the BSR becomes operational whenever the JTAG TAP controller 102 is active.

The JTAG TAP controller 102 can be a 16-state finite state machine (FSM) that controls the JTAG engine. Generally, at the rising edge of TCK 114, TMS 112 determines the TAP controller's 102 state sequence. TMS 112 has an internal pull-up resistor to provide a logic 1 to the system if TMS is not driven. The state of TMS at the rising edge of TCK determines the sequence of state transitions. There are basically two state transition paths for sampling the signal at TDI 116: one for shifting information to the IR 106 and one for shifting data into the DR 120.

Figure 2:
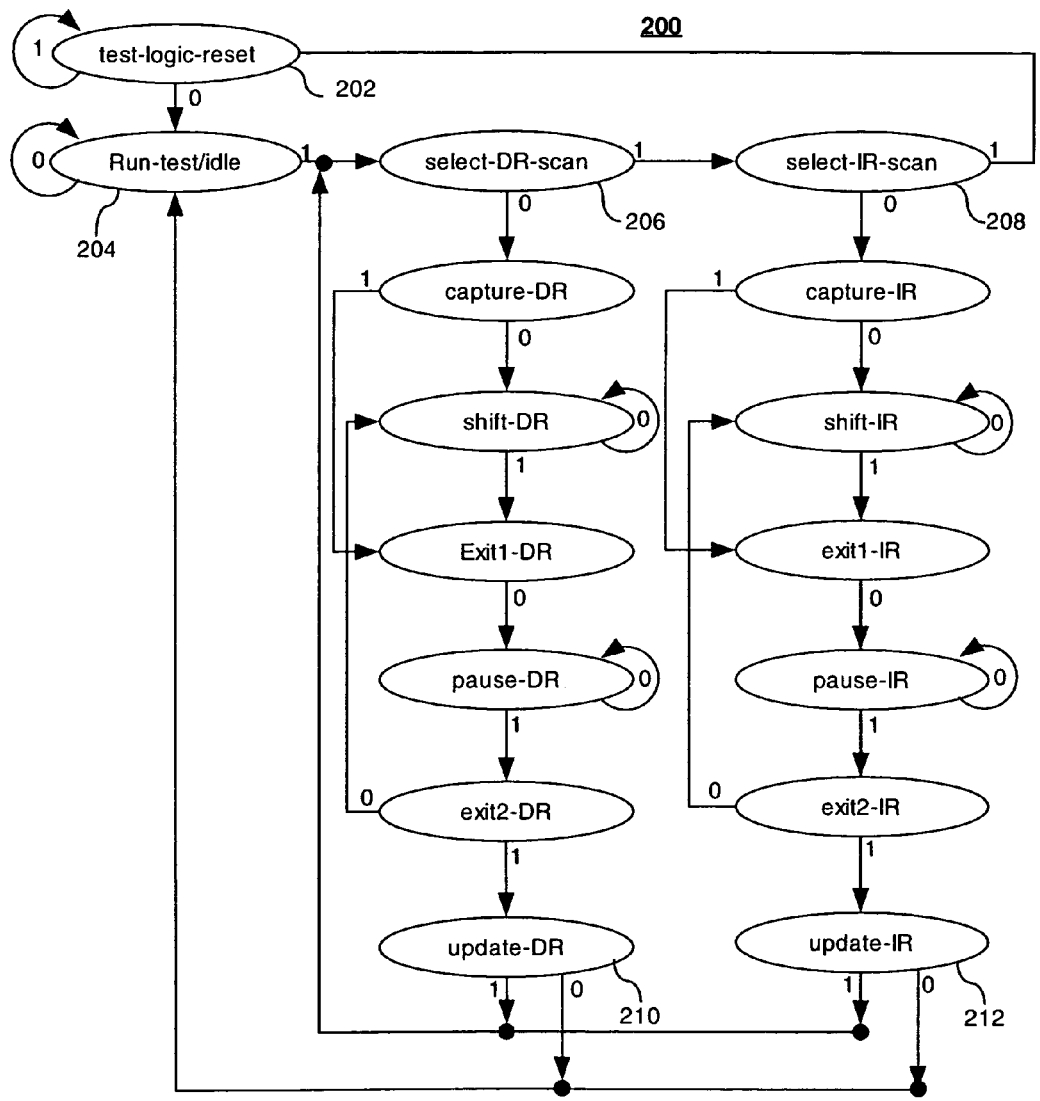
FIG. 2 is a state transition diagram for the state machine of a JTAG TAP controller utilized by the JTAG boundary scan interface of FIG. 1.

Referring now to FIG. 2, there is shown a state transition diagram 200 for a FSM of the JTAG TAP controller 102 utilized by the JTAG boundary scan interface of FIG. 1. With reference to FIG. 2, the following description defines the 16 states of the JTAG TAP Controller 102. The test-logic-reset state is entered on device power-up when at least five TCK 114 clocks occur with TMS 112 held high. Entry into this state resets all JTAG TAP logic so that it does not interfere with the normal component logic. At this time the IR 106 is reset to an IDCODE instruction.

In the run-test/idle state certain operations can occur depending on the current instruction. For example, the run-test-idle state can cause the program generation, verification, erasure and power-on-reset (POR) pulses to occur when an associated instruction is active.

The select-DR-scan is a transitional state that is entered prior to performing a scan operation on a data register. Additionally, the select-DR-scan transitional state is a state that is entered while transitioning to the select-IR-scan state.

The select-IR-scan is a transitional state entered prior to performing a scan operation on the instruction register or when returning to the test-logic-reset state.

The capture-DR state permits the loading of data from parallel inputs into the data register selected by the current instruction. Loading of data occurs at the rising edge of TCK 114. If the selected DR 120 has no parallel inputs, the DR 120 remains in its current state.

In the shift-DR state, data is shifted by one stage in the currently selected register from TDI 116 towards TDO 118 on each rising edge of TCK 114.

The exit1-DR is a transitional state that permits a transition to the pause-DR state or a transition directly to the update-DR state.

The pause-DR is a wait state that permits shifting of data to be temporarily halted.

The Exit2-DR is a transitional state that permits a transition to the update-DR state or a return to the shift-DR state to continue accepting data.

In the update-DR state, the data contained in the currently selected DR is loaded into a latched parallel output for registers that have a latch. Loading occurs on the falling edge of TCK 114 after entering the update-DR state. The parallel latch prevents changes at the parallel register output from occurring during the shifting process.

In the capture-IR state, data gets loaded from parallel inputs into the instruction register on the rising edge of TCK 114. The least two significant bits of the parallel inputs must have the value 01, and the remaining 6 bits are either hard-coded or used for monitoring security and data protect bits.

In the shift-IR state, data in the IR gets shifted one state towards TDO 118 on each rising edge of TCK 114.

The exit1-IR is a transitional state that permits a transition to the pause-IR state or the update-IR state.

The pause-IR permits shifting of an instruction to be temporarily halted.

The exit2-IR is a transitional state that permits either passage to the update-IR state or a return to the shift-IR state to continue shifting in data.

In the update-IR, state IR 106 values are parallel latched on the falling edge of TCK 114. The parallel latch prevents changes at the parallel output of the instruction register from occurring during the shifting process.

Referring to FIG. 2, the state initial state of the JTAG TAP controller 102 is test-logic-reset 202. While in the test-logic-reset state 202, an input of 1 causes the JTAG TAP controller 102 to remain in the test-logic-reset state 202. However, an input of 0 results in a jump to the run-test/idle state 204. While in the run-test/idle state 204, an input of 0 causes the JTAG TAP controller 102 to remain in the run-test/idle state 204. However, an input of 1 results in a transition to the select-DR-scan state 206.

Once the select-DR-scan state 206 is entered, all other DR 120 operations are sequenced from the select-DR-scan state as shown in the diagram 200. While in the select-DR-scan state 206, an input of a 1 causes a transition to the select-IR-scan state 208. Once the select-IR-scan state 208 is entered, all other IR operations are sequenced from the select-IR-scan state 208 as shown in the state transition diagram 200. An input of a 1 while in the select-IR state 208 causes a transition to the test-logic-reset state 202.

An input of a 0 while in an update-DR state 210 or an update-IR state 212 results in the JTAG TAP controller 102 returning to the run-test/idle state 204. However, an input of a 1 while in the update-DR state 210 or the update-IR state 212 results in the JTAG TAP controller 102 returning to the select-DR-scan state 206.

FIG. 2 highlights an inherent drawback and the inflexibility of existing JTAG TAP architecture. The FPGA has a JTAG TAP and each IP processor core embedded in the FPGA can have its own JTAG TAP. Typically, more than one IP processor cores are nested in the FPGA. In a case where more than one, for example two or four (FIG. 3, 306a, 306b, 306c, 306d), IP processor cores are embedded in an FPGA, the length of the instruction register is hard wired and as a result, each of the JTAG TAP ports for each embedded IP core cannot be flexibly accessed. This prevents certain verification and debugging tools from selecting among the nested JTAG TAPS, which IP processor core JTAG TAP to access.

Figure 3:
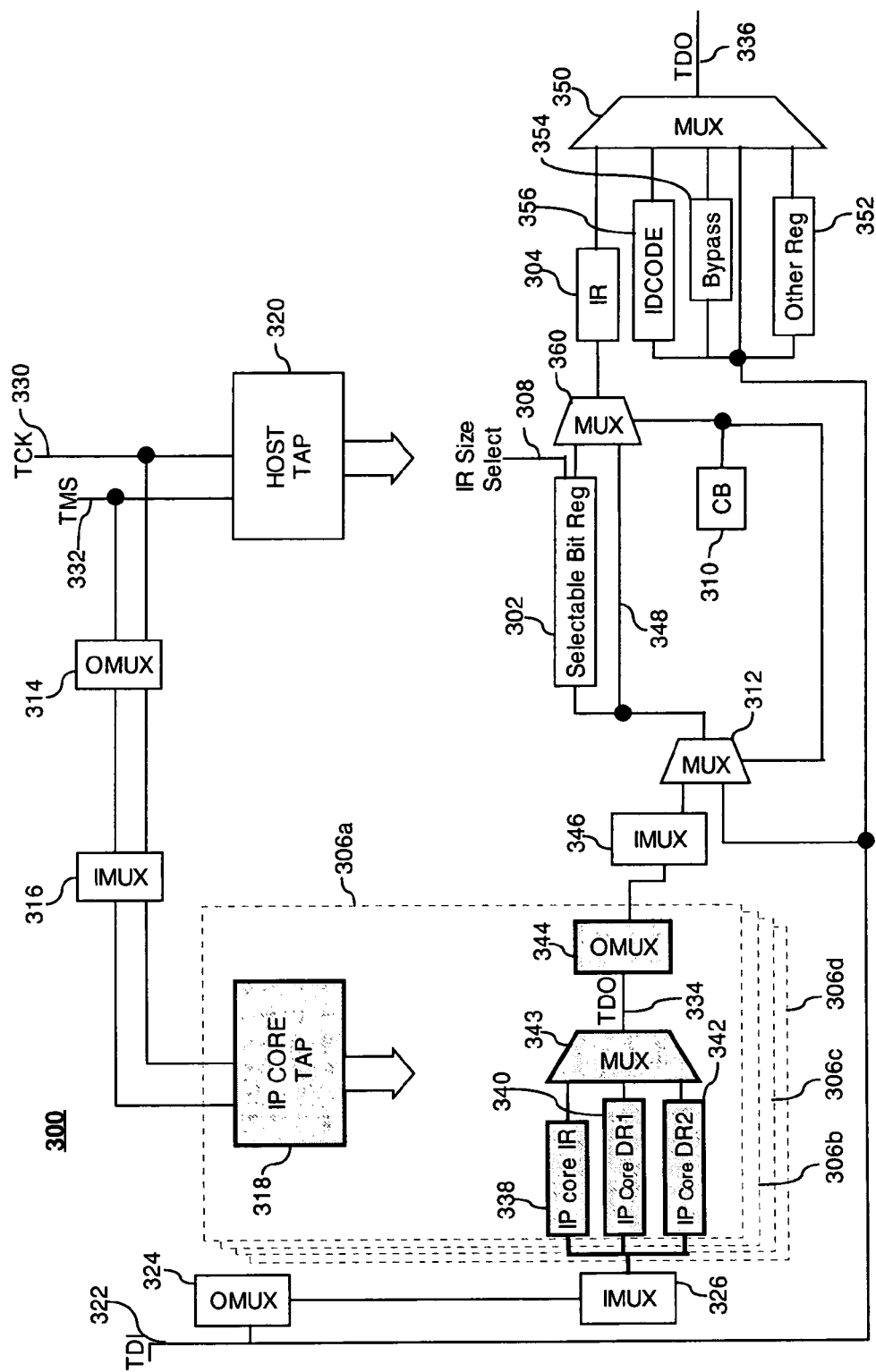
FIG. 3 is a diagram of a flexible configuration for nesting JTAG TAP controllers in accordance with the inventive arrangements.

FIG. 3 is a diagram of a flexible configuration 300 for nesting JTAG TAP controllers in accordance with the inventive arrangements. Referring to FIG. 3, a selectable bit register 302 advantageously provides flexibility in the JTAG TAP architecture by permitting selection of various register sizes to accommodate one or more IP cores, for example 306a, 306b, 306c and 306d. For illustrative purposes, and without unduly limiting the scope of the invention, the IP processor core 306a can require an additional 4 bits to be added to IR 304. Depending on the specific IP processor core, a different amount of bits can be required for extending the IR 302. The IR size select signal can be used to select these additional 4 bits from the selectable bit register 302. Notably, if a second similar IP processor core was added to the FPGA, the IR 304 would require and additional 8 bits extending it to the required length of 14 bits, even though IR 304 would still be 6 bits in length. The result is that the IR 304 has an apparent length of 14 bits. The IR size select signal 308 can select the additional 8 bits from the selectable bit register 302. Importantly, in a case where four similar IP processor cores were added to the FPGA, the IR 304 would require and additional 16 bits extending it to the required length of 22 bits, even though IR 304 would still be 6 bits in length. In this case, the apparent length of the IR 304 is 22 bits. The IR size select signal 308 can be used to select the additional 8 bits from the selectable bit register 302.

In operation, signals from host tap 320 can be multiplexed or otherwise connected to the IP processor core TAP 318. TMS signal 332 and TCK signal 330 from host TAP 320 can be connected to IP processor core 318 using output multiplexer (OMUX) 314 and input multiplexer 316. IMUXes and OMUXes are known in the art. Notwithstanding, IMUXs and OMUXs can be used to programmably connect to elements in the FPGA such as the configurable logic blocks (CLBs). Additionally, the IMUXes and OMUXes can connect to the IP processor core(s) and the JTAG TAP signals TCK 330, TDI 322, TDO 336, and TMS 332.

TDI signal 322 can be connected to an embedded processor core 306a through OMUX 324 and IMUX 326. OMUX 324 and IMUX 326 can provide access to the signals and registers. Although only connections to the IP processor core IR 338 and IP processor core DR1 340 and IP processor core DR2 342 are shown, the invention is not limited in this regard. The resulting output signals from IP processor core IR 338 and IP processor core DR1 340 and IP processor core DR2 342 can be multiplexed by MUX 343 to create the resulting TDO signal 334. TDO signal 334 can change state on the falling edge of TCK 330 and can be configured to be active only during the shifting of data through the embedded processor core 306a. At all other times, TDO signal 334 can remain in a tri-state condition. TDO signal 334 can subsequently be processed by OMUX 344 and IMUX 346 respectively. The resulting signal from IMUX 346 is then connected as an input to the multiplexer 312.

TDI signal 322 can also act as an input to multiplexer 312. Configuration bit 310 can be a single bit register and can be configured as an input to multiplexer 312 and multiplexer 360. In this arrangement, the configuration bit 310 can function as a JTAG TAP enable/disable signal. Advantageously, configuration bit 310 can be used determine whether the embedded IP processor core has been programmed or whether the JTAG TAPs for the embedded IP processor cores should be connected. In operation, configuration bit 310 enables selection between the output of IMUX 346 and the TDI signal 322, which are both inputs to MUX 312. Additionally, configuration bit 310 enables selection between the bypass signal 348 and the output of the selectable bit register 302, which are both inputs to MUX 312. Advantageously, configuration bit 310 permits the TDI signal 322 to bypass the selectable bit register when there is no need for the JTAG TAP controller of IP processor core 306a to be connected.

IR size select 308 can be implemented as a register having 2 bits. However, the invention is not limited in this regard and registers of other bit sizes can be used without departing from the spirit of the invention. In a 2-bit register arrangement, "00" can represent the selection of zero bits from the selectable bit register 302. This can represent a default state, wherein none of the JTAG TAP controllers are selected. Consequently, there is no need to extend the apparent length of the IR 304. In the default case, the bits in the selectable bit register 302 are not used and the output of multiplexer 312 traverses path 348, thereby bypassing the selectable bit register 302.

A "01" can represent the selection of four bits from the selectable bit register 302. These four bits can be used to extend the apparent length of the IR 304 to 10 bits in order to accommodate a single JTAG TAP controller. A "10" can represent the selection of eight bits from the selectable bit register 302. These eight bits can be used to extend the apparent length of the IR 304 to 14 bits in order to accommodate two JTAG TAP controllers. Finally, a "11" can represent the selection of sixteen bits from the selectable bit register 302. These sixteen bits can be used to extend the apparent length of the IR 304 to 22 bits in order to accommodate four JTAG TAP controllers. Programmable interconnects can be used to connect the embedded IP processor cores 306a, 306b, 306c and 306d selected for connection.

In the event that one or more of the JTAG TAPs for the embedded IP processor cores will be used, the IP processor cores can be connected through the programmable interconnect structure of the FPGA. IR size select 308 can determine the number of bits in the selectable bit register 302 that will be used to increase the apparent size of the IR 304. In this regard, the configuration bit 310 can deactivate the path 348. For example, if four JTAG TAP controllers will be used, namely one for each embedded IP processor core, then 16 bits in the selectable bit register 302 will be selected and the apparent size of the IR 304 will be 22. Multiplexer 350 can subsequently multiplex the output of the IR 304 and any bits in the selectable bit register 302, and any output from registers 356, 354, 352 and TDI signal 322 to create the output TDO signal 336.

In light of the foregoing description of the invention, it should be recognized that the present invention can be realized in hardware, software, or a combination of hardware and software. A method and system for flexibly nesting JTAG TAP controllers in an FPGA-based SoCs such as FPGA-based embedded processor SoCs according to the present invention can be realized in a centralized fashion in one computer system, or in a distributed fashion where different elements are spread across several interconnected computer systems. Any kind of computer system, or other apparatus adapted for carrying out the methods described herein, is suited. A typical combination of hardware and software could be a general purpose computer system with a computer program that, when being loaded and executed, controls the computer system such that it carries out the methods described herein.

The present invention can also be embedded in a computer program product, which comprises all the features enabling the implementation of the methods described herein, and which, when loaded in a computer system, is able to carry out these methods. Computer program or application in the present context means any expression, in any language, code or notation, of a set of instructions intended to cause a system having an information processing capability to perform a particular function either directly or after either or both of the following a) conversion to another language, code or notation; b) reproduction in a different material form.

Additionally, the description above is intended by way of example only and is not intended to limit the present invention in any way, except as set forth in the following claims.

What is claimed is:

1. A method for flexibly nesting JTAG TAP controllers for IP cores in a FPGA-based system-on-chip (SoC), the method comprising:
   selecting an IP core JTAG TAP controller to be coupled in series with a host JTAG TAP controller;
   selecting at least one available bit from a selectable bit register of said host JTAG TAP controller, said selectable bit register having a plurality of available bits; and
   extending an apparent length of an instruction register of said host JTAG TAP controller by using said at least one available bit from said selectable bit register, wherein the apparent length of said instruction register of said host JTAG TAP controller comprises a combination of the length of said instruction register of said host JTAG TAP controller, the length of an instruction register of said selected IP core JTAG TAP controller, and optionally, the length of the selectable bit register.

2. The method according to claim 1, wherein said step of selecting an IP core JTAG TAP controller to be coupled in series with a host JTAG TAP controller comprises a step of choosing at least one IP core JTAG TAP controller from a plurality of IP core JTAG TAP controllers nested in the FPGA-based SoC, said chosen at least one IP core JTAG TAP controller becoming communicably accessible by said host JTAG TAP controller.

3. The method according to claim 1, wherein said step of extending is done to emulate an instruction register of an IP core before configuration of an FPGA on the SoC.

4. The method according to claim 2, further comprising the step of shifting an instruction for said chosen at least one IP core JTAG TAP controller through said instruction register having said extended length, said shifted instruction causing said chosen at least one IP core JTAG TAP controller to execute said instruction.

5. The method according to claim 1, wherein said step of selecting at least one available bit further comprises manually selecting said at least one available bit from said selectable bit register.

6. The method according to claim 1, wherein said step of selecting at least one available bit further comprises programmably selecting said at least one available bit from said selectable bit register.

7. A method for flexibly accessing nested JTAG TAP controllers for IP cores in a FPGA-based SoC, the method comprising:
   choosing at least one IP core JTAG TAP controller from a plurality of JTAG TAP controllers nested in the FPGA-based SoC;
   programmably connecting said selected at least one IP core JTAG TAP controller to a host JTAG TAP controller; and
   selecting an apparent register size of an instruction register of said host JTAG TAP controller, wherein the apparent register size of said instruction register of said host JTAG TAP controller comprises the combined size of an instruction register for said at least one IP core JTAG TAP controller, the size of said instruction register of said host JTAG TAP controller, and optionally, the size of the selectable bit register.

8. The method according to claim 7, wherein the step of selecting the apparent register size comprises a step of selecting at least one bit from a selectable bit register of said host JTAG TAP controller, said selectable bit register having a plurality of available bits.

9. The method according to claim 8, further comprising extending an apparent length of an instruction register of said host JTAG TAP controller, said apparent length of said instruction register including a combined length of said at least one bit from said selectable bit register and said bits comprising said instruction register.

10. The method according to claim 9, further comprising the step of shifting an instruction through said instruction register having said combined length, said shifted instruction for causing the instruction to be executed in said JTAG TAP controller of said chosen IP core JTAG TAP controller.

11. A system for flexibly accessing nested JTAG TAP controllers for IP cores in a FPGA-based SoC, the system comprising:
   a selectable bit register in a host JTAG TAP controller comprising at least one available bit; and
   a selector for selecting said at least one available bit, said selector extending an apparent length of an instruction register of said host JTAG TAP controller coupled in series with an IP core JTAG TAP controller by using said selected at least one available bit from said selectable bit register, wherein the apparent length of said instruction register comprises a combination of a length of an instruction register of said IP core JTAG TAP controller, a length of said instruction register of said host JTAG TAP controller, and optionally, the length of the selectable bit register.

12. The system according to claim 11, further comprising a multiplexer for choosing at least one IP core JTAG TAP controller from a plurality of IP core JTAG TAP controllers nested in the FPGA-based SoC, said chosen at least one IP core JTAG TAP controller becoming communicably accessible by said host JTAG TAP controller.

13. The system according to claim 12, further comprising a shift circuit for shifting an instruction for said chosen at least one IP core JTAG TAP controller through said selected instruction register having said extended length, said shifted instruction causing said chosen at least one IP core JTAG TAP controller to execute said instruction.

14. A system for flexibly accessing nested JTAG TAP controllers for IP cores in a FPGA-based SoC, the system comprising:
   a selector for choosing at least one IP core JTAG TAP controller from a plurality of JTAG TAP controllers nested in the FPGA-based SoC;
   a multiplexer for programmably connecting said at least one IP core JTAG TAP controller to a host JTAG TAP controller; and an instruction register size select signal enabling the selection of an apparent register size of an instruction register of said host JTAG TAP controller, wherein the apparent register size of said instruction register of said host JTAG TAP controller comprises a combination of a size of an instruction register of said at least one IP core JTAG TAP controller, a size of said instruction register of said host JTAG TAP controller, and optionally, the size of the selectable bit register.

15. The system according to claim 14, further comprising a selectable bit register for said host JTAG TAP controller, said selectable bit register having at least one bit available for selection.

16. The system according to claim 15, wherein said selectable bit register extends an apparent length of an instruction register of said host JTAG TAP controller, said apparent length of said instruction register including a combined length of said at least one bit from said selectable bit register and said bits comprising said instruction register.

17. The system according to claim 16, further comprising a shifting circuit for shifting an instruction through said instruction register having said combined length, said shifted instruction for causing an instruction execution in said chosen IP core JTAG TAP controller.

18. A method for ensuring an information register length for nested JTAG TAP controllers for IP cores remains the same before and after a configuration of an FPGA in an FPGA-based system-on-chip (SoC), the method comprising:
   forming instruction registers for the IP cores that are in series with the instruction register of the FPGA of the SoC;
   forming connections between FPGA JTAG logic of the FPGA and IP Core JTAG logic of the IP core using a programmable interconnect; and
   emulating an instruction register of the IP core prior to configuration of the FPGA using a shift register of the same length as the instruction register of the IP core.

19. The method of claim 18, wherein the method further comprises the step of selectably accessing the nested JTAG TAP controllers of the IP cores via a programmable input/output (IO).

20. The method of claim 18, wherein the step of emulating comprises the step of selectably varying the size of the shift register based on the number of IP cores in a given configuration of the SoC.

21. A system for performing boundary scan functions on a plurality of IP cores, the system comprising:
   an FPGA-based system-on-chip (SoC) comprising a plurality of IP cores each including a first JTAG TAP controller; and
   a host JTAG TAP controller coupled to each of the first JTAG TAP controllers, said host JTAG TAP controller comprising a selectable bit register enabling the selection of an apparent register size of an instruction register of the host JTAG TAP controller, wherein the apparent register size of the instruction register of the host JTAG TAP controller comprises a combination of a size of an instruction register of the first JTAG TAP controller for each IP core of the plurality of IP cores, the size of the instruction register of the host JTAG TAP controller, and optionally, the size of the selectable bit register.

22. The system of claim 21, wherein the FPGA-based SoC includes the host JTAG TAP controller.

23. The system of claim 21, further comprising:
   a selector circuit coupled between the first JTAG TAP controllers and the host JTAG TAP controller.

24. The system of claim 23, wherein the FPGA-based SoC includes the host JTAG TAP controller and the selector circuit.

25. The system of claim 21, wherein the selectable bit register comprises an input terminal coupled to the selector circuit and an output terminal providing a selected bit; and wherein the host JTAG TAP controller comprises an instruction register having an input terminal coupled to the output terminal of the selectable bit register, the instruction register having an output terminal providing an instruction having an apparently extended length.

26. The system of claim 25, further comprising:
   a selector circuit coupled between the first JTAG TAP controllers and the host JTAG TAP controller.

27. The system of claim 25, wherein the FPGA-based SoC includes the host JTAG TAP controller.

* * * * *